May 12, 1970 D. M. JACKSON, JR., ET AL 3,511,702
EPITAXIAL GROWTH PROCESS FROM AN ATMOSPHERE COMPOSED OF A HYDROGEN HALIDE, SEMICONDUCTOR HALIDE AND HYDROGEN
Filed Aug. 20, 1965
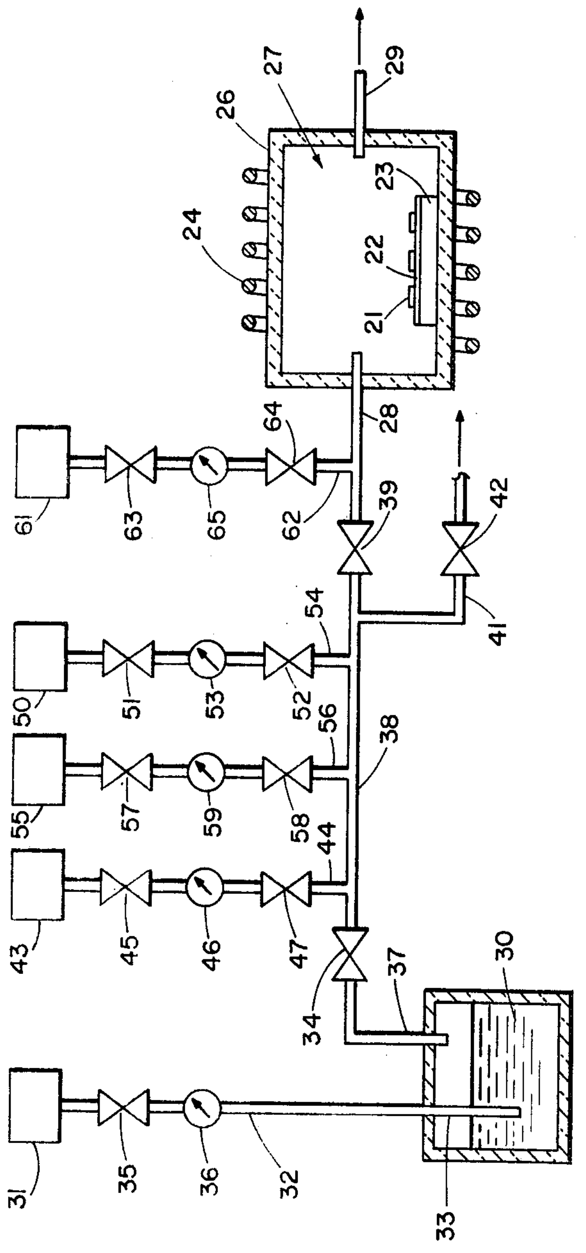
INVENTORS
Don M. Jackson Jr.
Bernard W. Boland
BY
Mueller, Aichele & Rauner
ATT'YS.

United States Patent Office 3,511,702

Patented May 12, 1970

3,511,702

EPITAXIAL GROWTH PROCESS FROM AN ATMOSPHERE COMPOSED OF A HYDROGEN HALIDE, SEMICONDUCTOR HALIDE AND HYDROGEN

Don M. Jackson, Jr., and Bernard W. Boland, Scottsdale, Ariz., assignors to Motorola, Inc., Franklin Park, Ill., a corporation of Illinois Filed Aug. 20, 1965, Ser. No. 481,331

Int. Cl. B44d *1/18*

U.S. Cl. 117—212 10 Claims

ABSTRACT OF THE DISCLOSURE

The epitaxial growth of semiconductor layers is confined to selected areas with the use of an oxide mask. The simultaneous growth of polycrystalline semiconductor material on the oxide mask is prevented by the continuous addition of a small amount of hydrogen halide to the gaseous mixture passed through the epitaxial reactor.

This invention relates to a new and improved method of epitaxially growing semiconductor material on a substrate, and more particularly relates to a novel method of epitaxial-growing on selected areas of an oxide masked surface of a substrate.

Epitaxial material, as that term is used herein, means monocrystalline material whose crystallographic orientation is determined by the substrate on which it is formed. The proces by which epitaxial material is formed is known as epitaxial growth, or sometimes as epitaxis. At least one crystallographic plane of the substrate crystal has the same crystallographic orientation and lattice constants as the desired epitaxial layer, and the epitaxial layer is grown on a surface parallel to that plane. The material of the epitaxial layer and the substrate may be the same, although this is not essential.

While epitaxial growth has been successfully employed in the growth of single crystal material over an entire surface of a substrate, it has not been possible heretofore to selectively grow epitaxial material in openings of an oxide masked surface of a substrate. The epitaxial material not only will grow in the openings in the oxide mask but also over the surface of the oxide as well. As a result, it previously has been necessary to remove the excess deposited material which forms on the oxide mask. This removal step removes a portion or all of the oxide layer which creates an additional problem. Thus, in practice, it has been customary to remove the complete oxide layer and form a new oxide layer over the entire surface of the substrate including that on which epitaxial regions have been grown. However, this is not always an acceptable expedient.

Other masking materials have been employed in an attempt to overcome the problems connected with epitaxial growth on the silicon dioxide layer. However, these masking materials have created other difficulties and problems in processing and have not provide a simple means for selectively growing an epitaxial layer onto a substrate which has been masked with silicon dioxide.

An object of the present invention is to provide a method of growing epitaxial material over selected portions of an oxide masked substrate.

A further object of the invention is to provide a method of growing epitaxial material over an oxide masked surface of a substrate while confining substantially all of the growth to the unmasked portions of the substrate.

An additional object is to provide a method for growing epitaxial material over unmasked portions of a substrate without damaging the silicon dioxide mask and without requiring removal of growth adhering to the oxide.

A feature of the present invention is a method of growing epitaxial material on selected portions of an oxide masked substrate by employing a hydrogen halide in the epitaxial growth mixture.

Another feature of the invention is a method of confining epitaxial growth to areas not oxide masked by employing a gaseous mixture comprising a hydrogen halide, a semiconductor compound and hydrogen.

The invention is illustrated by the accompanying drawing, the single figure of which is a schematic diagram showing a system for selectively growing epitaxial layers in accordance with the method of the invention.

The present invention is embodied in a method for selectively growing semiconductor material on a masked surface of a substrate, which method comprises forming an oxide layer on a surface of a substrate, forming a masking pattern with openings of said oxide layer, subjecting the oxide masked surface to a gaseous mixture comprising a hydrogen halide, a semiconductor compound, and hydrogen while maintaining the material at an elevated temperature whereby epitaxial material is grown on the exposed surface of the substrate without substantially any growth on the surface of the oxide. The upper limit of the reaction temperature is the melting point of the particular material being treated.

The substrate which is treated in accordance with the method of the present invention is advantageously a semiconductor material, e.g., a single crystal element of silicon or germanium, although various semiconductor compounds also may be employed. The crystal element is advantageously a wafer which is typically obtained from a larger crystal grown by known crystal pulling or zone melting processes. The larger crystal is sliced into wafers and the wafers lapped, polished and otherwise processed to make their major faces substantially parallel to each other. The cross-sectional dimension of the wafers may be of any value and the thickness of the wafers can be within a practical range, e.g., about 4 to 40 mils.

A thin layer of silicon dioxide is formed on the surface of the substrate prior to the epitaxial deposition step. The oxide may be formed in several known ways, e.g., by thermal oxidation or more advantageously by depositing an oxide layer in an epitaxial reactor by subjecting heated wafers to a gaseous mixture comprising a semiconductor compound and a source of oxygen. A silicon dioxide film one or two microns thick may be formed in a relatively short time in an epitaxial reactor.

Openings are formed through the silicon dioxide by the employment of a masking pattern which is formed on the surface of the oxide by conventional processes. It may include the use of a commercial resist composition which is photosensitive and which hardens when exposed to light. For example, a pattern having a large number of repeated representations is exposed onto the resist-coated surface of the wafer causing the exposed portions of the coating to harden and the unexposed portions to remain in soluble conditions. When the soluble portions are removed, the desired pattern of openings is formed on the surface of the oxide. The openings may be cut through the oxide with a suitable chemical etchant. Advantageously, a mineral acid such as hydrofluoric acid is employed to etching the openings in the oxide mask.

The semiconductor compound used to form the vapors employed in the epitaxial growth step may be any of the known sources employed in the semiconductor art and advantageously is a compound from the group consisting of the semiconductor tetrachlorides, trichlorides and hydrides.

The hydrogen halide employed in the epitaxial growth step may be hydrogen chloride, hydrogen bromide, hydrogen iodide or hydrogen fluoride, with hydrogen chloride being particularly useful.

In accordance with one embodiment of the method of the invention, wafers are placed in a reactor which may be a quartz tube heated by induction coils. The wafers are positioned on a quartz slab inside the reactor. Advantageously the temperature when germanium is being treated is maintained between about 500° and 900° C. and preferably between about 725° and 800° C. In the treatment of silicon, the temperature is advantageously between about 800° and 1400° C., and preferably between about 900° and 1200° C.

The gaseous epitaxial growth mixture advantageously comprises between about 0.01% and 10% by volume of the hydrogen halide, and the proportion of the gaseous compound of the semiconductor material is advantageously between about 0.01% and 5% by volume. Preferably, the mixture contains between about 0.05% and 2% by volume of the hydrogen halide.

The profile or degree of flatness of the outer surface of the growth regions may be controlled by varying the amounts of the hydrogen halide and the semiconductor compound present in the growth mixture. A relatively flat surface generally is obtained when the semiconductor compound comprises approximately 10% of the hydrogen halide present, although this may vary depending upon other conditions of the growth step. If the proportion of the semiconductor compound is much less than about 10%, the surfaces of the growth regions will tend to be concave, while when the proportion is significantly above 10%, the surfaces will tend to be convex.

A suitable system for conducting the method of the present invention is shown in the drawing. In the embodiment is shown a single crystal semiconductor material in the form of wafers 21 which are placed on a slab 22 of quartz carried on a susceptor 23 of graphite or molybdenum. The upper face of each wafer advantageously is parallel to a selected crystallographic plane of the wafers, such as that identified by Miller Indices (111). The susceptor is heated by an induction heating coil 24 which is located on the outside of the quartz tube 26 which forms a reaction chamber. The gaseous epitaxial growth mixture is introduced into the reaction chamber through an inlet pipe 28. The byproducts of the reaction which takes place in the chamber 27 leave the chamber through outlet 29 and are vented or burned. The temperature within the reaction chamber may be measured by using an optical pyrometer which is not shown in the drawing.

Vapors may be formed from the liquid semiconductor compound, for example, silicon tetrachloride, contained in a saturator 30. Hydrogen gas from a source 31 is passed over or through the liquid by means of suitable piping lines 32 and 33. The flow rate of the incoming hydrogen gas is controlled by valve 35 and is measured by a meter 36. An outlet line 37 from the saturator 30 leads to a main line 38 which connects to the inlet 28 of the reaction chamber through a valve 39. Line 38 has a shut-off valve 34. In starting the system, valve 39 is closed and the gas mixture from lines 37 and 38 is vented through a piping line 41 containing valve 42 while the gas mixture is being stabilized.

The proportion of semiconductor compound vapors in the hydrogen gas may be controlled accurately by diluting the outgoing gas from the saturator 30 with additional quantities of hydrogen gas supplied from another source 43, through main piping line 44 which connects into line 38. Line 44 has valves 45 and 47 and a meter 46 for controlling and measuring the flow rate of the hydrogen gas which comprises the main portion of the epitaxial growth mixture.

The vapor pressure over the liquid in the saturator 30 is kept constant by maintaining the saturator at a constant temperature such as with cooling coils (not shown). The resulting gas mixture is passed through line 37 into line 38 where a small proportion of a hydrogen halide is added thereto from a source 50. Line 50 has valves 51 and 52 and a meter 53. The resulting gas mixture in line 38 consisting of small proportions of the semiconductor compound and hydrogen chloride in hydrogen gas is passed into chamber 27 and over the surface of wafers 21 growing epitaxial regions in the exposed portion of the wafers not covered by the oxide layer without growing epitaxial material on the silicon dioxide surface.

The oxide mask may be formed by growing a silicon dioxide layer on the wafers 21 in the reaction chamber 27 prior to the epitaxial growth step. A source of oxygen 55 may be introduced into line 38 by means of a piping line 56. Line 56 has valves 57 and 58 and a meter 59. The oxygen source mixes with the vapors of the semiconductor compound and hydrogen from source 43. The resulting mixture passes through line 38, into chamber 27 and over the surfaces of wafers 21 growing a silicon dioxide layer on the surfaces of the single crystal wafers. Typical oxide growth temperatures range from about 100° to 1400° C. and preferably from about 900° to 1200° C. for silicon and from about 500° to 900° C. for germanium.

After the oxide layer is formed on the wafers, the wafers are removed from the furnace and the desired openings formed in the oxide layer to constitute the mask. The openings may be formed by first applying a photoresist composition to the oxide surface and exposing a mask pattern onto the resist coated surface, for example, causing the exposed portions of the coating to harden and the unexposed portions to remain in a soluble condition. When the soluble portions are removed such as with a solvent, and the exposed oxide removed, e.g., by etching, the desired pattern of masking openings is formed on the surface of the wafer. The wafers are then replaced in the reaction chamber and the epitaxial growth step initiated as described above.

Before starting the growth step, it is advantageous to flush the reaction chamber 27 by introducing a stream of hydrogen from a source 61 through line 62 into inlet 28 and into the chamber. Line 62 has valves 63 and 64 and a meter 65. During this flushing operation, valve 39 is closed. Doped epitaxial films may be obtained by introducing minor amounts of doping impurities into the main gas stream 38 from other sources (not shown).

While the above illustration describes the growth of epitaxial material on an original surface of a substrate which has been exposed by the removal of portions of the silicon dioxide mask, the method of the invention is also useful in so-called etch-out and backfill procedures. For example, after the surface of the substrate has been exposed, additional portions of the substrate may be removed such as by etching, and epitaxial material thereafter grown in the cavity either to the original substrate surface or to the top of the oxide layer.

Another procedure which may be carried out in accordance with the present invention is to dope portions of the material grown and thereby provide layers of different resistivity. This procedure is particularly useful in the deposition of an initial layer of high purity content which subsequently may be diffused into the body of the substrate.

The following examples illustrate specific embodiments of the invention, although it is not intended that the examples in any way restrict the scope of the invention.

EXAMPLE I

The above-described apparatus was employed to grow masked area epitaxial layers on single crystal silicon wafers by the following procedure. A number of silicon wafers of a size about one inch in diameter and about 7.5 mils thick were placed on a quartz covered graphite boat and the boat inserted into a reactor. The reactor was heated to a temperature of about 1100° C. and flushed with hydrogen. A stream of carbon dioxide gas having a flow rate of about one liter per minute and a vapor mixture of silicon tetrachloride and hydrogen having a flow rate of about 300 cubic centimeters per minute were mixed with a hydrogen gas mainstream flowing at a rate of about 35 liters per minute. The carbon dioxide and hydrogen were of very high purity and contained less than about two parts per million of total impurities. Hydrogen gas was passed through a vessel containing liquid silicon tetrachloride at about 25° C. to form the vapor. The purity of the silicon tetrachloride was such that it was capable of forming silicon having a resistivity of more than about 30 ohm-centimeters.

The gas mixture containing about 1% by volume of silicon tetrachloride and about 3% by volume of carbon dioxide was passed through the epitaxial reactor at about 1150° C. for about 15 minutes after which the reactor was cooled and the boat containing the silicon dioxide coated wafers removed from the reactor. The dioxide coating was about 10,000 angstroms in thickness. A layer of "Kodak Metal Etch Resist," a photosensitive composition sold by Eastman Kodak Company, was applied to the silicon dioxide coated surfaces of the wafers and cured at a temperature of about 100° C. The coated wafers were dried and then a photographic negative was placed over each wafer and the combination subjected to ultraviolet light. The exposed portions of the coating hardened and the unexposed portions were removed by washing with alcohol. The wafers were then etched with dilute hydrofluoric acid which removed the exposed portions of the silicon dioxide layer revealing the surface of the silicon wafers.

The wafers were then placed on the boat and the boat reinserted in the reactor. The reactor was again heated to a temperature of about 1100° C. and at this time flushed with hydrogen. A stream of hydrogen gas at a flow rate of about 35 liters per minute and a stream of gaseous hydrogen chloride at a flow rate of about 300 cubic centimeters per minute were mixed with a vapor mixture of silicon tetrachloride and hydrogen having a flow rate of about 100 cubic centimeters per minute. The hydrogen was of very high purity and contained less than about one part per million of impurities. The silicon tetrachloride was from the same source as that employed in the oxide growth step and was maintained at a temperature of about 25° C. while hydrogen gas was passed therethrough. The tetrachloride constituted about 0.1% by volume of the gas mixture which was passed through the epitaxial reactor for about 30 minutes after which the reactor was cooled and the boat containing the wafers removed from the reactor.

The wafers were examined visually and the epitaxial layers grown on the exposed surfaces of the silicon wafers were found to be smooth and uniform and substantially free from any inclusions. The oxide masks surrounding the epitaxial growth were unaffected and no epitaxial deposition had taken place on the oxide. The wafers were further examined under a microscope, and the visual results were confirmed.

Semiconductor wafers such as transistors, diodes, etc., made by the above procedure exhibited electrical properties equal to or better than devices made by other processes.

EXAMPLE II

The pocedure of this example was the same as that of Example I except for the following: The wafers were single crystal germanium. A silicon dioxide layer was formed on the germanium wafers by passing a gaseous mixture of nitrogen and ethyltriethoxysilane over the germanium wafers heated to about 700° C. After the openings had been cut in the oxide layer an epitaxial layer was grown over the exposed portions of the wafers following the procedure of Example I by heating the wafers to about 700° C. and employing germanium tetrachloride instead of silicon tetrachloride in the hydrogen mainstream. The resulting wafers were examined, and it was found that the epitaxial growth was confined to the openings in the mask, and the oxide surfaces were free of growth. Devices made from the resulting wafers exhibited the same high quality as devices of the previous example.

EXAMPLE III

The procedure of this example was the same as that of Example I except that the flow rate of hydrogen chloride in the epitaxial gas mixture was changed to about 600 cubic centimeters per minute. The epitaxial growth was confined to the unmasked areas of the wafers similar to the results of the previous examples.

EXAMPLE IV

The procedure of this example was the same as that of Example II except that the flow rate of hydrogen chloride was about 100 cubic centimeters per minute. The selective growth of the previous examples was achieved.

EXAMPLE V

The procedure of this example is the same as that of Example I except in place of hydrogen chloride, hydrogen bromide was employed. The same superior results were achieved as those in the previous example.

The above description, drawing and examples show that the present invention provides a novel method of growing epitaxial material on selected portions of an oxide masked semiconductor material. Furthermore, by the method of the invention the epitaxial growth is confined to areas which are not masked with the oxide. Moreover, the method provides the growth over the unmasked portions of the semiconductor material without damaging the oxide mask and without requiring removal of growth from the oxide.

It will be apparent from the above description, examples and drawing that various modifications in the detailed procedures set forth may be made within the scope of the invention. Therefore, the invention is not intended to be limited to the specific procedures except as may be required by the following claims.

What is claimed is:

1. A method of selectively growing silicon or germanium on a masked surface of a semiconductor substrate, which method comprises forming an oxide layer on a surface of said substrate, forming openings in said oxide layer, subjecting said substrate to a gaseous mixture comprising a silicon or germanium halide, a hydrogen halide and hydrogen while maintaining the temperature of said material between about 500° and 900° C. for depositing germanium and between about 800° and 1400° C. for depositing silicon, said gaseous mixture comprising between about 0.01% and 5% by volume of said silicon or germanium halide and between about 0.01% and 10% by volume of said hydrogen halide, whereby epitaxial silicon or germanium is grown on the exposed surface of said semiconductor substrate without substantially any growth on said oxide.

2. A method according to claim 1 in which silicon is deposited.

3. A method according to claim 1 in which germanium is deposited.

4. A method according to claim 1 in which silicon is deposited and the temperature is maintained between about 900° and 1200° C.

5. A method according to claim 1 in which germanium is deposited and the temperature is maintained between about 725° and 800° C.

6. A method according to claim 1 in which the hydrogen halide is hydrogen chloride.

7. A method according to claim 1 in which the hydrogen halide is hydrogen bromide.

8. A method according to claim 1 in which the gaseous mixture comprises silicon tetrachloride, hydrogen chloride and hydrogen.

9. A method according to claim 1 in which silicon is deposited and the gaseous mixture comprises hydrogen, between about 0.01% and 5% by volume of silicon tetrachloride and between about 0.02% and 2% by volume of hydrogen chloride.

10. A method according to claim 1 in which germanium is deposited and the gaseous mixture comprises hydrogen, between about 0.01% and 5% by volume of germanium tetrachloride and between about 0.05% and 2% by volume of hydrogen chloride.

References Cited

UNITED STATES PATENTS

| | | | |
|---|---|---|---|
| 3,392,069 | 7/1968 | Merkel et al. | 156—17 |
| 3,142,596 | 7/1964 | Theuerer | 148—175 |
| 3,156,591 | 11/1964 | Hale et al. | 148—175 |
| 3,192,083 | 6/1965 | Sirtl | 148—174 XR |
| 3,200,018 | 8/1965 | Grossman | 148—175 |
| 3,218,205 | 11/1965 | Ruehrwein | 148—175 |
| 3,243,323 | 3/1966 | Corrigan et al. | 148—175 |
| 3,265,542 | 8/1966 | Hirshon | 148—175 |
| 3,296,040 | 1/1967 | Wigton | 148—175 |

OTHER REFERENCES

Proc. of Metallurgical Society Conference, vol. 15, Aug. 30–Sept. 1, 1961, pp. 103–111.

L. DEWAYNE RUTLEDGE, Primary Examiner

P. WEINSTEIN, Assistant Examiner

U.S. Cl. X.R.

117—106, 107.2; 148—174, 175; 156—17; 252—62.3